(12) United States Patent
Nayebi et al.

(10) Patent No.: US 6,188,268 B1
(45) Date of Patent: Feb. 13, 2001

(54) LOW SIDE CURRENT SINK CIRCUIT HAVING IMPROVED OUTPUT IMPEDANCE TO REDUCE EFFECTS OF LEAKAGE CURRENT

(75) Inventors: Mehrdad Nayebi, Palo Alto; Stephen D. Edwards, San Jose; Phil Shapiro, Palo Alto, all of CA (US)

(73) Assignees: Sony Corporation of Japan, Tokyo (JP); Sony Electronics, Inc., Park Ridge, NJ (US)

( * ) Notice: Under 35 U.S.C. 154(b), the term of this patent shall be extended for 0 days.

(21) Appl. No.: 09/183,452

(22) Filed: Oct. 30, 1998

(51) Int. Cl.[7] ................................. G05F 1/10; G05F 3/02
(52) U.S. Cl. ............................................ 327/538; 327/543
(58) Field of Search ..................................... 327/538, 543

(56) References Cited

U.S. PATENT DOCUMENTS

| | | | |
|---|---|---|---|
| 5,254,938 | * 10/1993 | Ito | 323/369 |
| 5,680,348 | * 10/1997 | Chung et al. | 365/185.23 |
| 5,774,013 | * 6/1998 | Groe | 327/543 |

* cited by examiner

Primary Examiner—Terry D. Cunningham
Assistant Examiner—Quan Tra
(74) Attorney, Agent, or Firm—Wagner, Murabito & Hao LLP

(57) ABSTRACT

A low side, low voltage current sink circuit having improved output impedance to reduce effects of leakage current. A current sink circuit is described having a transistor having its emitter coupled to an emitter degeneration resistor which is coupled to the low side (e.g., ground) of a power supply. The output of the current sink is taken at the collector of the transistor. In one embodiment, the transistor is an NPN transistor device. The base of the transistor is coupled to the output of an operational amplifier. One input of the operational amplifier is coupled in a feedback loop to the emitter of the transistor. A direct current bias voltage is applied to the other input of the operational amplifier. In this arrangement, the output impedance ($R''_o$) of the current is sink is based on the open loop gain of the operational amplifier (e.g., about 35 dB) and is therefore orders of magnitude larger than the output impedance of other prior art current sink designs. The novel design limits the voltage drop over the emitter degeneration resistor thereby increasing the differential voltage swing at the collector of the transistor for low power applications. The present invention finds particular application within a clock generator circuit where its reduced leakage current properties and improved dynamic range help to reduce clock jitter in the clock generation circuit.

18 Claims, 9 Drawing Sheets

US 6,188,268 B1

LOW SIDE CURRENT SINK CIRCUIT HAVING IMPROVED OUTPUT IMPEDANCE TO REDUCE EFFECTS OF LEAKAGE CURRENT

BACKGROUND OF THE INVENTION

1. Field of the Invention

The present invention relates to the field current sink circuits. More particularly, the present invention relates to current sink circuits characterized by having increased output impedance.

2. Related Art

High speed digital systems, such as engineering workstations and personal computers, require clock sources that have low jitter and low phase lock loop (PLL) bandwidths. Phase jitter in a system clock reduces the effective clock speed of the workstation or personal computer. More processing performance is gained, for a given clock rate, if the clock signal has less jitter. The PLL circuitry typically contains a voltage controlled oscillator (VCO) that receives a voltage level maintained by filter components. Normally, charging currents and voltage controlled oscillator gains are so high that externally situated filter components are required to achieve the low jitter and bandwidth requirements. However, external, e.g., "off-chip," filter components (e.g., capacitors, etc.) increase the overall cost of the digital system in part by making manufacturing more complex, but also by increasing the physical size of the digital system. Further, off-chip filter components also decrease system reliability by increasing the phase jitter by allowing external noise to be injected into the clock circuit through the PLL filter. Clock jitter is reduced if external elements of the PLL loop filter can be eliminated. To integrate filter components "on-chip," it is necessary to use smaller sized filter components. However, this leads to tighter filter leakage requirements because smaller sized capacitors are more sensitive to changes in current when compared to larger sized capacitors.

It is desired to reduce the effects of leakage current within a PLL circuit because as discussed above on-chip filter components are very sensitive to small leakage currents. PLL filters are normally driven by current source or current sink circuits and require outputs having very high impedance. A problem exists in eliminating off-chip filters and placing them on-chip. Namely, reducing the size of the filters (thereby allowing them to be placed on-chip) unfortunately also makes these components more sensitive to leakage current which impedes the ideal operation of certain PLL circuits. As a result, it is desired to use current sources that have reduced leakage current to drive differential filters for higher PLL accuracy. At the same time, this circuitry needs to operate from increasingly lower power supply voltages; e.g., to accommodate hand-held and other portable battery operated applications.

In operation, a PLL circuit injects current into filter components to establish a voltage at the input of a voltage controlled oscillator circuit in order to alter the frequency of oscillation of the PLL. This current is then ideally held constant over a long period of time (e.g., a "hold time") to maintain the oscillation frequency. Leakage across the filter component during the hold time, which exists between PLL correction pulses, will charge the filter component thereby changing its voltage. This changing voltage causes time jitter in the clock frequency because it changes the input voltage to the internal voltage controlled oscillator circuit. Therefore, it is necessary to reduce leakage current associated with the PLL filter component in order to provide an accurate oscillation frequency.

One method for reducing leakage current associated with the PLL filter component is to increase the output impedance, Ro, of the current source or sink which can be used to supply current to the PLL filter component, e.g., a capacitor.

FIG. 1 illustrates a single transistor prior art embodiment of a current sink circuit 10. The transistor 14 has its emitter (E) coupled to the low side 18 (e.g., ground) of a power supply, its base (B) coupled to a DC bias voltage 20 and its collector (C) coupled to the current output node 30. As shown, the output node 30 of the current sink circuit 10 is also coupled to an exemplary voltage load 16 which is coupled to the power supply 12. The dashed element 32 is not a physical component but merely models the output impedance, Ro, of the current sink circuit 10. In this configuration, the output impedance, Ro, is a function of the early voltage (Ve) of the transistor 14 divided by the current, Ic, through the transistor 14 and is represented by:

$$Ro=Ve/Ic=(kT/q)/Ic$$

where k, T and q are well known values defined by the physics of the transistor 14. In a typical case, Ve is 6 volts and Ic is 20 uA so Ro is approximately 300 K ohms as shown by:

$$Ro=6 \text{ volts}/20 \text{ uA}=300 \text{ K ohms}.$$

In the general case, Ro can vary higher and lower by a factor of two for the current source 10 as shown in FIG. 1.

FIG. 2 illustrates another prior art implementation 50 which improves the output impedance of the current sink circuit. The improvement is gained by the addition of an emitter degeneration resistor, RE, 26. Resistor 26 is placed between the low side 18 and the emitter (E) of transistor 14. Some of the extra current injected by a change in collector voltage at (C) is reinjected through the emitter (E) and this current partially cancels the extra current. Therefore, the fraction of the extra current reinjected depends on the ratio of 1/gm to RE. In this configuration, the output impedance, R'o, of current sink circuit 50 is expressed as:

$$R'o=Ro(1+gm*RE)$$

where Ro is the output impedance of current sink circuit 10 of FIG. 1 and gm is a well known constant defined by the physics of transistor 14. Assuming RE is on the order of 1 K ohm resistance, and gm is approximately $1 \times 10^{-4}$, then the output impedance, R'o, of the current sink circuit 50 becomes:

$$R'o=Ro(1+0.8)=1.8*Ro.$$

Although the value of R'o represents approximately an 80% increase in output impedance over the output impedance of the current sink circuit 10 of FIG. 1, a current sink circuit having an higher output impedance would even further reduce the effects of leakage current.

SUMMARY OF THE INVENTION

Accordingly, what is needed is a current sink circuit having a higher output impedance than realized by the prior art current sink circuits described above. What is further needed is a low side current sink circuit (e.g., one coupled to the low side of the voltage supply) having a higher output impedance than realized by the prior art current sink circuits described above. What is also needed is a low side current sink circuit having a higher output impedance than realized by the prior art current sink circuits described above that can also effectively operate within a low power supply voltage environment. Such a current sink can advantageously be used to alter the charge on an integrated circuit capacitor. The present invention provides these advantageous capabilities.

A low side low power current sink circuit is described herein having improved output impedance to reduce effects of leakage current. The present invention includes a current sink circuit having a transistor with its emitter coupled to an emitter degeneration resistor which is coupled to the low side (e.g., ground) of a power supply. The output of the current sink is taken at the collector of the transistor. In one embodiment, the transistor is an NPN transistor device. The base of the transistor is coupled to the output of an operational amplifier. One input of the operational amplifier is coupled in a feedback loop to the emitter of the transistor. A direct current bias voltage is applied to the other input of the operational amplifier. In this arrangement, two feedback loops are used and the output impedance (R"o) of the current is sink is based on the open loop gain of the operational amplifier (e.g., about 35 dB) and is therefore orders of magnitude larger than the output impedance of other prior art current sink designs.

The novel design of the present invention also limits the voltage drop over the emitter degeneration resistor thereby increasing the differential voltage swing at the collector of the transistor for low power applications. In one embodiment, a resistor ladder is used as the emitter degeneration resistor element. The present invention finds particular application within a clock generator circuit where its reduced leakage current properties and improved dynamic range help to reduce clock jitter in the output clock signal.

In a clock generator circuit having a phase lock loop circuit, embodiments of the present invention specifically include a current sink circuit having a stable output current for maintaining a voltage at the input of a voltage controlled oscillator, the current sink circuit comprising: an emitter degeneration resistor coupled to the low side of a supply voltage and coupled to a first node; a transistor device comprising: an emitter coupled to the first node; a collector coupled to an output node; and a base, wherein the current sink circuit supplies current from the output node; an operational amplifier circuit having an output coupled to the base of the transistor device, the operational amplifier circuit also having a first input and a second input, the first input coupled to the first node to provide a feedback loop, the operational amplifier circuit for maintaining constant any current flowing through the transistor device to provide a high output impedance for the current sink circuit; and a bias voltage applied to the second input of the operational amplifier circuit.

Embodiments include the above and wherein the voltage supply is low and within the phase lock loop circuit comprises an integrated circuit capacitor element coupled to the output node and wherein the collector of the transistor alters the charge across the integrated circuit capacitor element.

DETAILED DESCRIPTION OF THE INVENTION

In the following detailed description of the present invention, a low side, low power, current sink circuit having improved output impedance for reducing effects of leakage current, numerous specific details are set forth in order to provide a thorough understanding of the present invention. However, it will be recognized by one skilled in the art that the present invention may be practiced without these specific details or with equivalents thereof. In other instances, well known methods, procedures, components, and circuits have not been described in detail as not to unnecessarily obscure aspects of the present invention.

Figure 3A:
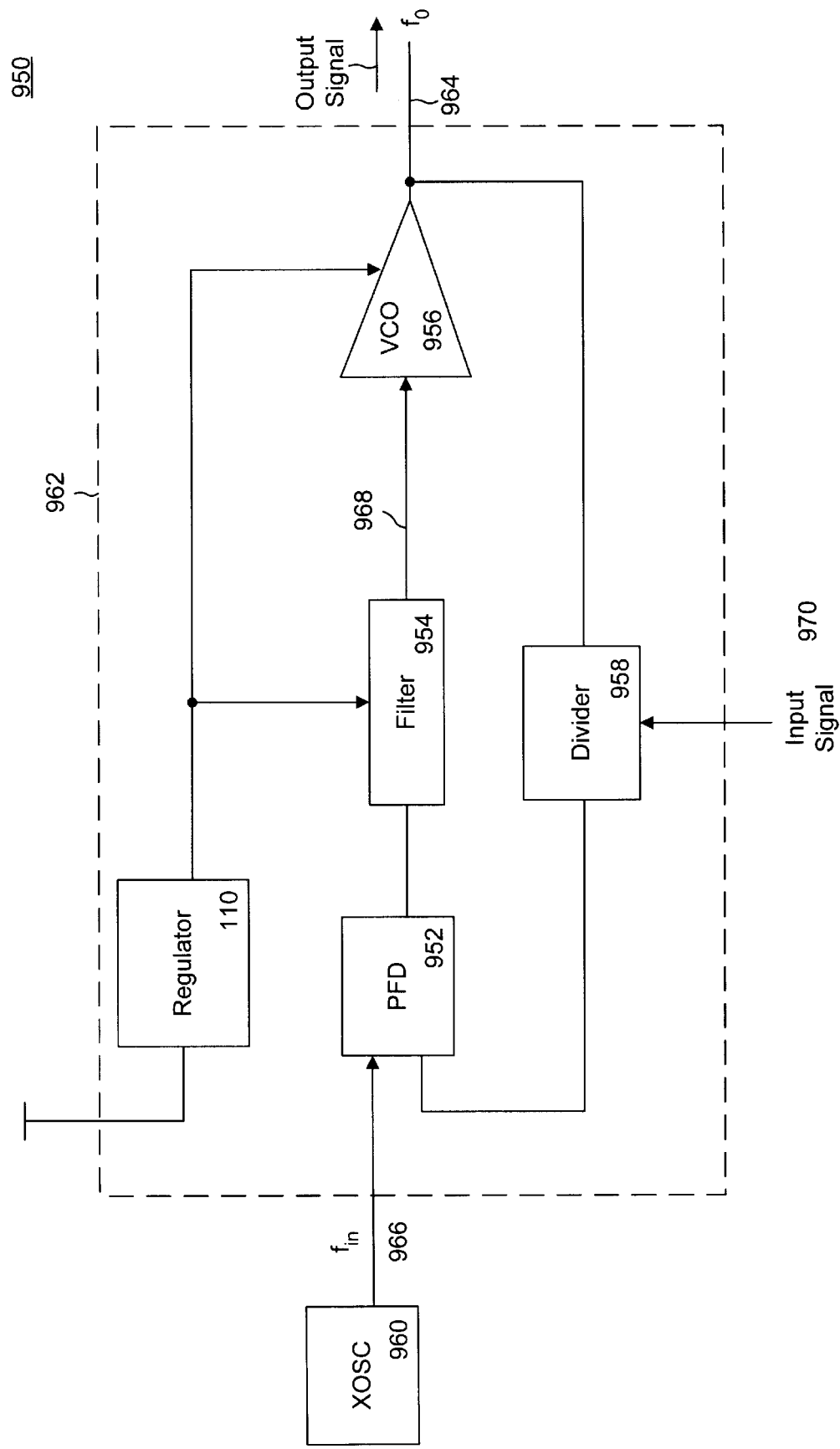
FIG. 3A is a logical block diagram of a clock generation circuit in which the present invention may be implemented.

FIG. 3A is a logical block diagram of a clock generator circuit 962 in which embodiments of the present invention can be implemented. Clock generator circuit 962 includes an oscillator 966 that generates an input frequency (fin) at 966. A phase frequency detector (PFD) circuit 952 is coupled to receive frequency 966 and is coupled to a divider circuit 958 which receives an external divider control signal 970. The PFD circuit 952 is coupled to a filter circuit 954 which is also coupled to a voltage controlled oscillator (VCO) circuit 956 which is coupled in feedback to the divider circuit 958. The filter 954 and the VCO circuit 956 are coupled to receive power from a regulator 110 which is coupled to a power supply. The output of the VCO circuit 956 generates the output clock frequency (fo) at 964.

Figure 3B:
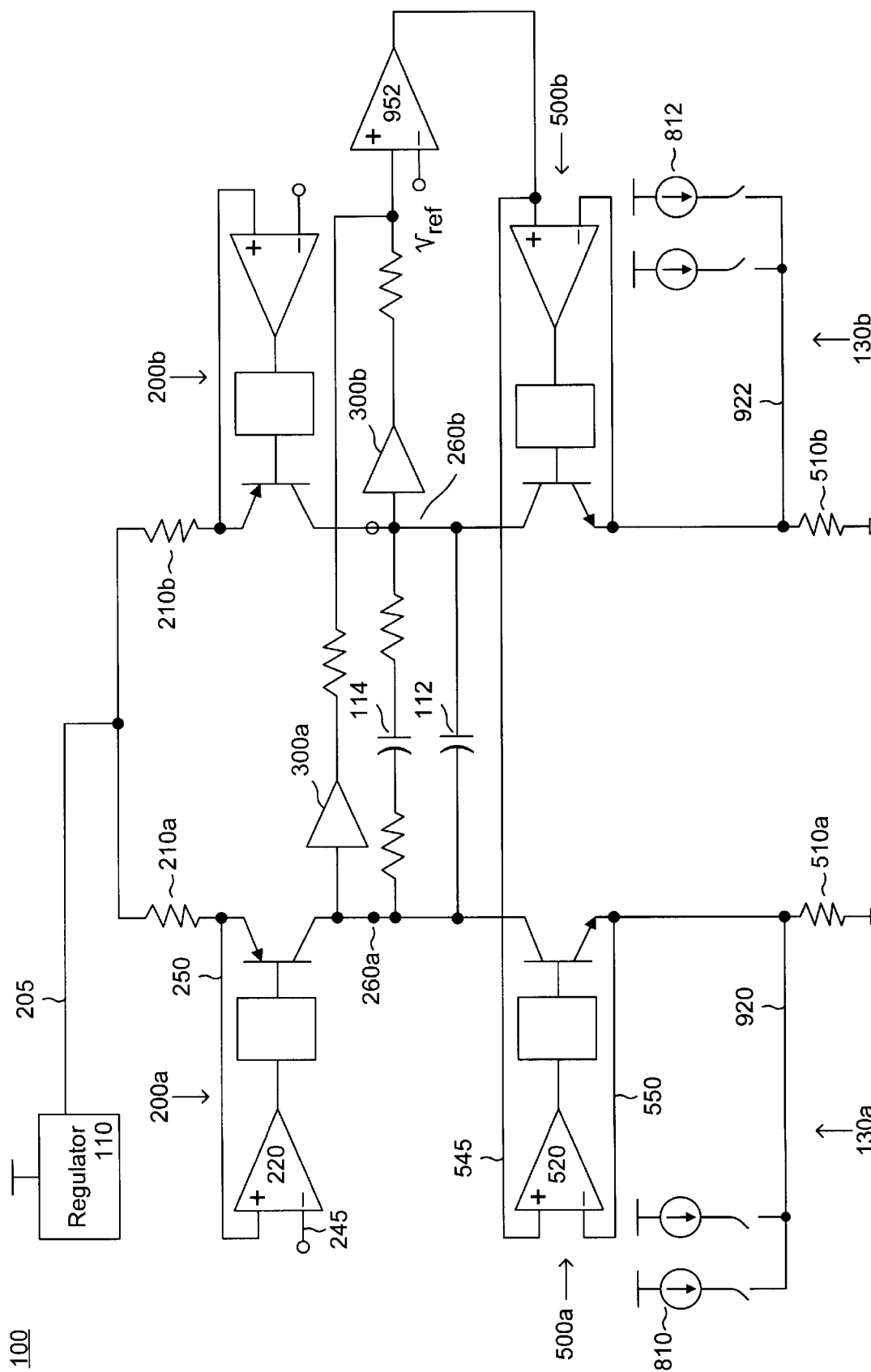
FIG. 3B illustrates phase lock loop implemented clock signal generator using the low side current sink circuit of the present invention.

FIG. 3B illustrates a clock generation circuit 100 as one example in which the current sink circuit of the present invention can operate. The low-side large output impedance current sink design of the present invention can operate in conjunction with a variety of different circuit systems where Ro cancellation is required, e.g., within a digital to analog converter circuit or within an operational amplifier circuit. Therefore, it is appreciated that the clock generation circuit 100 is only one example of such a circuit system.

Specifically, clock generation circuit 100 of FIG. 3B contains a phase lock loop circuit having a differential circuit configuration. Circuit 100 is implemented "on chip," that is a single integrated circuit chip is used to realize circuit 100. The high side of a power supply voltage is coupled to regulator 110. Although the high side voltage can be of a wide range of voltages, in one embodiment the high side voltage is approximately within the range of 2.5 to 3.3 volts. The regulator 110 is coupled via line 205 to two ends of a differential circuit configuration having differential side 130a and differential side 130b. Voltage supply line 205 is coupled to resistors 210a and 210b. Resistor 210a is coupled to the other elements of current source 200a. Current source 200b also includes to resistor 210b. Current sources 200a and 200b are described in co-pending U.S. patent application Ser. No. 09/183,321, concurrently filed herewith, entitled "High Side Current Source Circuit Having Improved Output Impedance to Reduce Effects of Leakage Current," by Nayebi et al., attorney docket number SONY-50M2412 and assigned to the assignee of the present invention and incorporated herein by reference. As also described therein, current sink 200a contains a feedback loop 250 and an operational amplifier circuit 220 which receives a direct current (DC) bias voltage at its (−) input 245 and the feedback loop 250 at its (+) input. A charge pump injects current over line 920.

The current sink circuits 500a and 500b of the present invention are now discussed. The ground node of FIG. 3B is coupled to resistors 510a and 510b. Resistor 510a is included within current sink circuit 500a of the present invention and is coupled to the low side of the power supply (e.g., ground). Current sink circuit 500b includes resistor 510b which is coupled to the low side of the power supply (e.g., ground). As described herein, current sink circuit 500a contains a feedback loop 550 and an operational amplifier circuit 520 which receives a direct current (DC) bias voltage at its (−) input over line 545 and the feedback loop 550 at its (+) input. A charge pump 810 injects additional current over line 920. The current sink circuit 550b, also of the present invention, is of an analogous design but located in differential side 130b of clock generation circuit 100.

The current source circuits 200a and 200b are used, in combination with current sink circuits 500a and 500b of the present invention, to maintain a current flow through filter elements 112 and 114. In addition to this current, current is injected by charge pumps 810 and 812 to thereby establish a differential voltage across the filter elements 112 and 114. Filter elements 112 and 114 are integrated circuit capacitors and as such they are integrated within the IC chip of circuit 100. The differential voltage is used as an input to a voltage controlled oscillator circuit of the phase lock loop circuit within clock generation circuit 100. It is desired to provide a stable voltage at the input of the voltage controlled oscillator circuit in order to reduce clock jitter within clock generation circuit 100. One way that the voltage can change across the filter elements 112 and 114 is as a result of current fluctuations in the currents maintained by sides 130a and 130b.

Specifically, leakage current across the filter elements 112 and 114 charges the filter elements 112 and 114 thereby changing their differential voltage. In circuit 100, the filter elements, e.g., capacitors 112 and 114, are designed to be small internal "on-chip" devices (having correspondingly small capacitance values). As a result, the voltage level across these small filter elements 112 and 114 is very sensitive to small changes in the injected currents at nodes 260a and 260b. The changing differential voltage across filter elements 112 and 114 causes time jitter in circuit 100 because it causes changes in the input voltage of the voltage controlled oscillator.

Buffer circuits 300a and 300b sample the voltage over the voltage elements. Buffer circuits contain a high impedance circuit as described in U.S. patent application Ser. No. 09/183,198, concurrently filed herewith, entitled "High Input Impedance Buffer Circuit," by Nayebi et al., attorney docket number SONY-50M2411 and assigned to the assignee of the present invention.

Therefore, in accordance with the design of the present invention, the current dropped from current sinks 500a and 500b is very stable once it is set to a desired level and held there over time. In accordance with the present invention, by reducing leakage current, the filter elements 112 and 114 maintain a stable differential voltage level. In operation, the current through current sinks 500a and 500b is adjusted to set a particular operational frequency of clock generation circuit 100 and then held over a hold period. Hold periods are situated in between phase lock loop correction pulses. The present invention advantageously reduces the effects of leakage current as one way to stabilize the current through current sinks 500a and 500b during the hold periods. The effects of leakage current are reduced, in accordance with the present invention, by establishing a high output impedance, R"o, for current sinks 500a and 500b. By using current sinks 500a and 500b that have high output impedance, leakage current is reduced thereby providing a stable input voltage to the voltage controlled oscillator of the phase lock loop circuit. The stable input voltage thereby reduces jitter in the output clock signal of circuit 100.

Figure 4A:
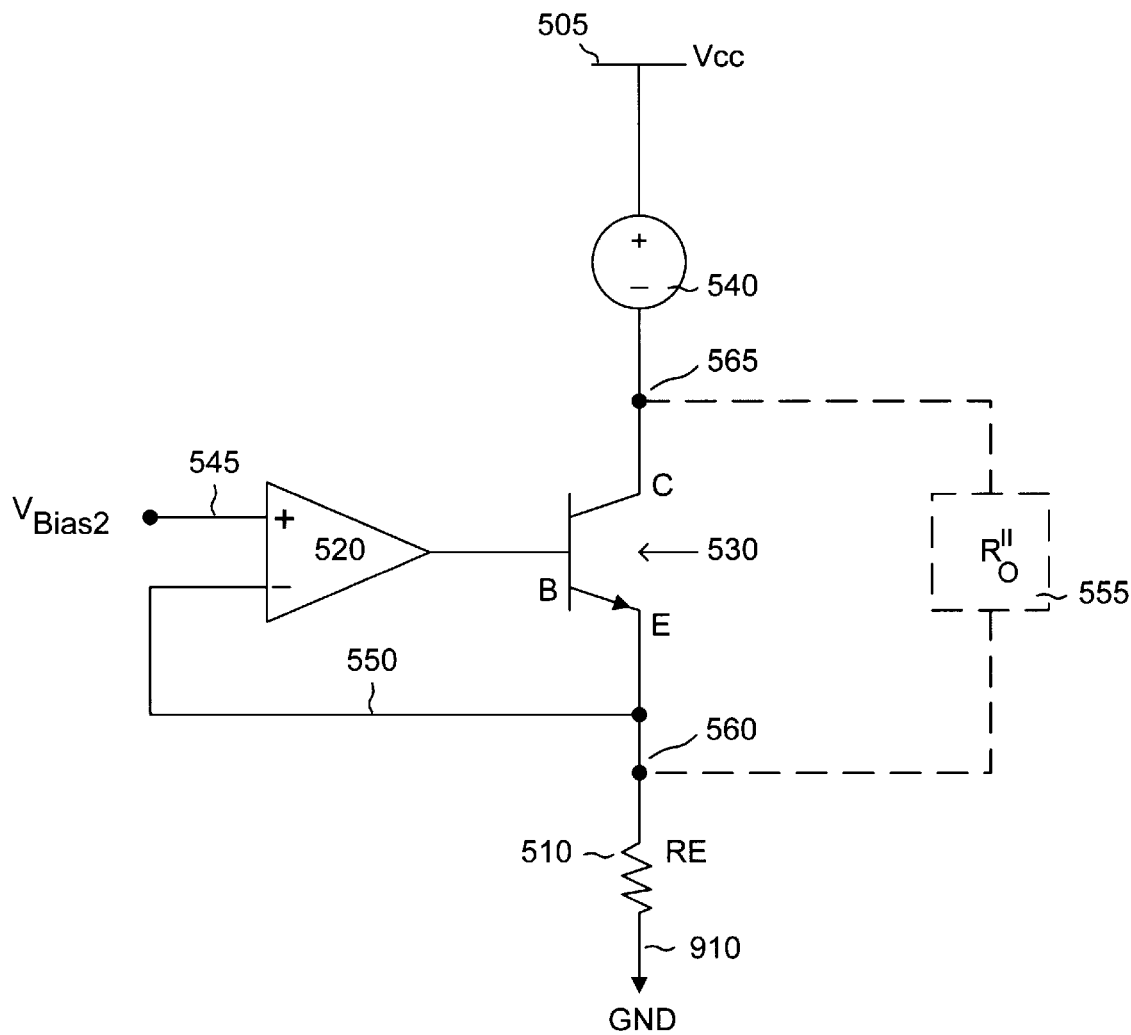
FIG. 4A illustrates a circuit block diagram of the low side current sink circuit of the present invention having high output impedance.

FIG. 4A illustrates one embodiment of the low-side current sink circuit 500 of the present invention. In accordance with the present invention, current sink circuit 500 has a very high output impedance, R"o, shown as 555. Current sink circuit 500 contains an emitter degeneration resistor, RE, 510 located in series between a first node 560 and the low side 910 (e.g., ground) of a power supply voltage. In one embodiment, the voltage supply (Vcc) 505 is a low voltage power supply. Circuit 500 includes a transistor 530 having its emitter (E) coupled to the first node 560. Current is dropped from the current sink circuit 500 at node 565 which is coupled to the collector (C) of transistor 530. An exemplary voltage load 540 is shown coupled to Vcc and to node 565, but this load 540 is not part of the current sink 500 of the present invention.

The base (B) of transistor 530 is coupled to the output of an operational amplifier circuit 520. The negative (−) input of the operational amplifier circuit 520 is coupled via feedback loop 550 to the first node 560. The positive (+) input of the operational amplifier circuit 520 is coupled to a bias direct current (DC) voltage level over line 545. In one embodiment, the bias voltage over line 545 is maintained by an operational amplifier (FIG. 3B). In the arrangement of FIG. 4A, the output impedance, R"o, is measured from node 560 to node 565 as shown by the dashed element 555 which is not a structural element but rather a model of R"o. In one embodiment of the present invention, transistor 530 is an NPN transistor, Vcc 505 is approximately between 2.0 and 3.3 volts and RE 510 is approximately 30 k ohms although other configurations can be used.

The emitter and base of transistor 530 of FIG. 4A are in the feedback loop. Vbias at 545 is equal to the voltage at the emitter (E) of transistor 530 and these values are held relatively constant by circuit 500. That is, any change in the voltage at the emitter (E) of transistor 530 caused by leakage current is compensated for by the closed feedback loop thereby holding the voltage at node 560 constant. Circuit 500 dynamically compensates the voltage at node 560 over changes in load, temperature, etc.

Figure 4B:
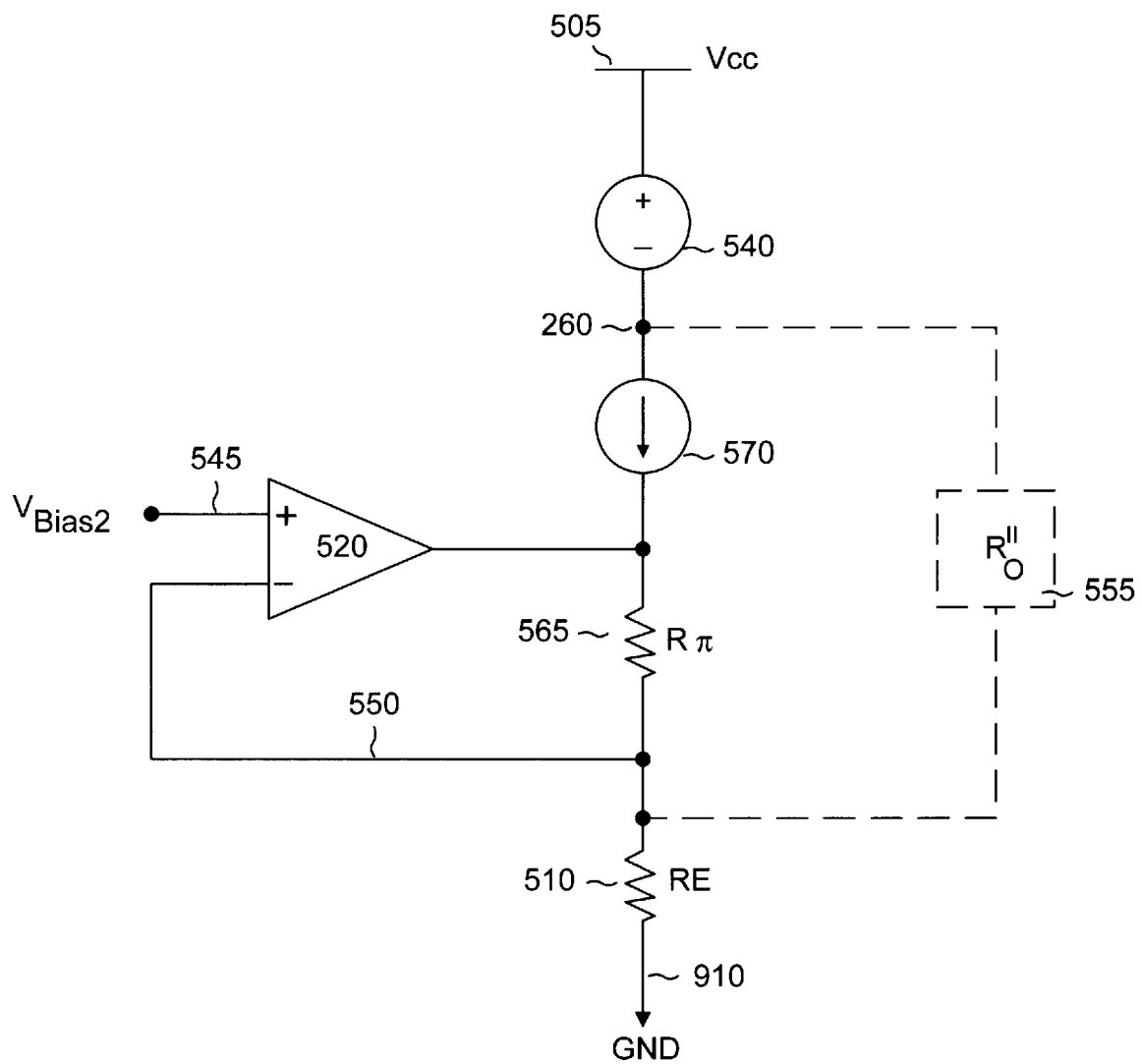
FIG. 4B is a circuit model of the low side current sink circuit of FIG. 4A in accordance with the present invention.

FIG. 4B illustrates a circuit model of circuit 500 of FIG. 4A. In FIG. 4B, circuit 500 is the same as shown in FIG. 4A except the transistor 530 is modeled as a resistor, Rpi 565, and an ideal current source ("sink") 570. Rpi is the input impedance and is equal to 1/gm where gm is a well known constant that is dependent on the physics of the transistor 530.

Figure 1:
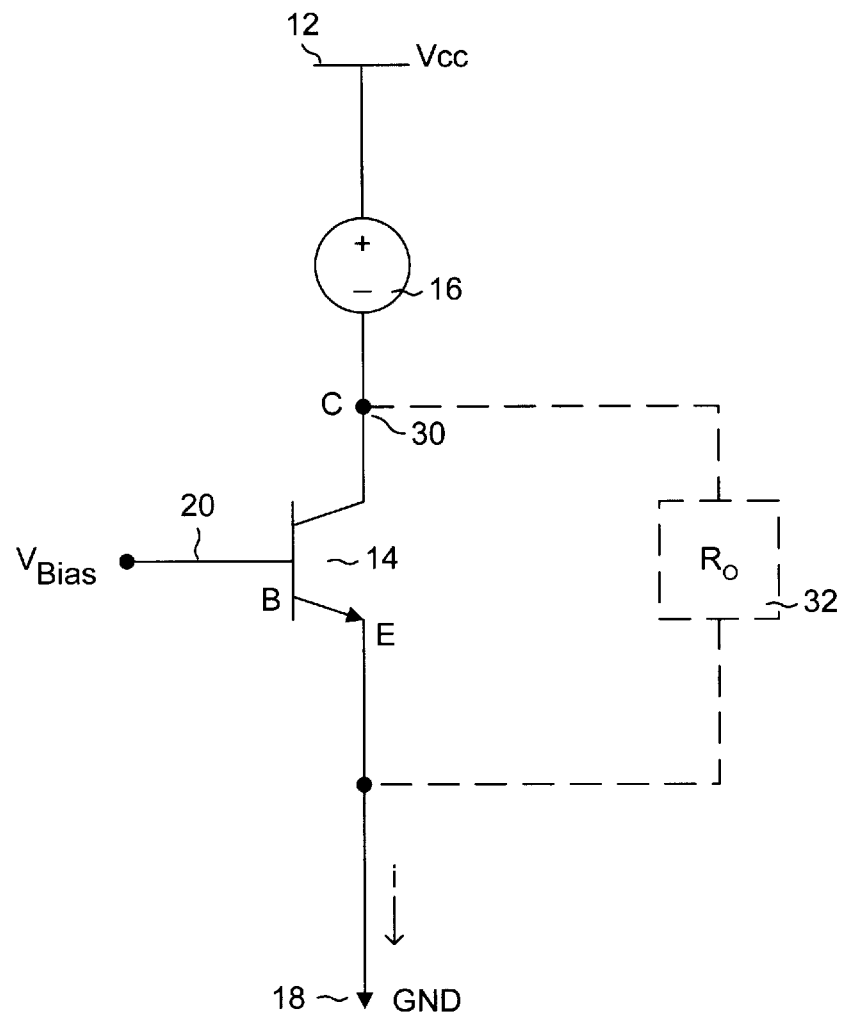
FIG. 1 illustrates a first low side current sink circuit of the prior art.
Figure 2:
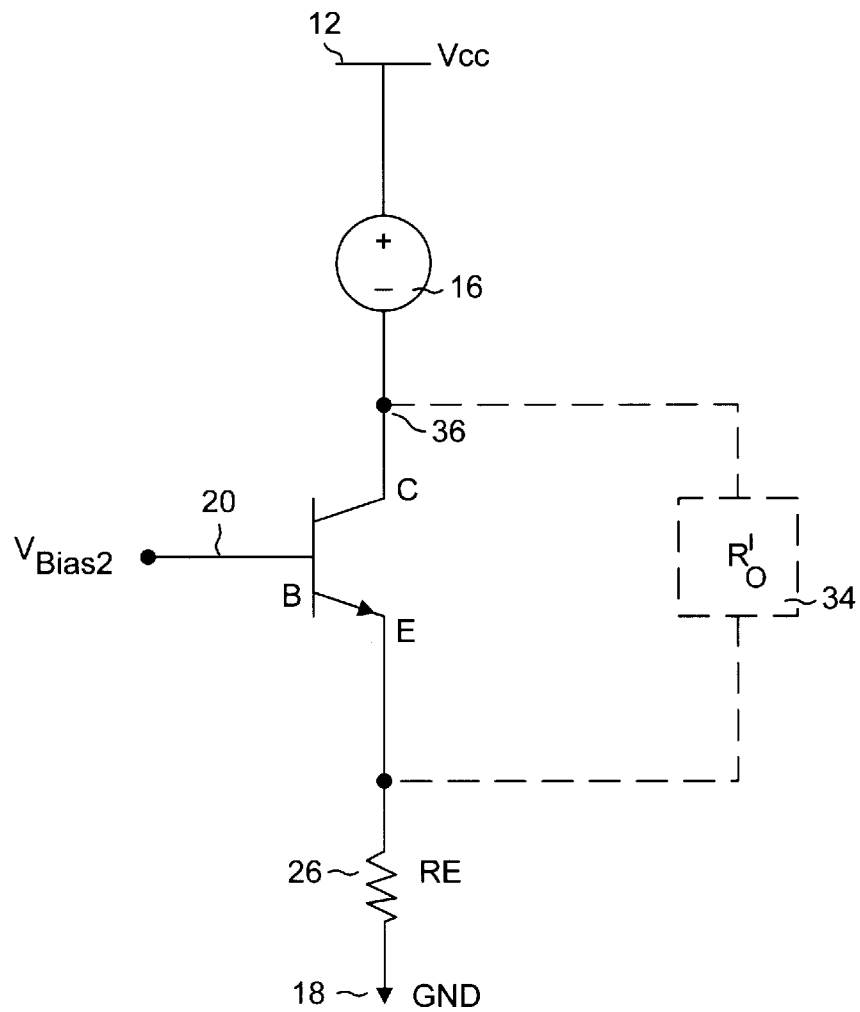
FIG. 2 illustrates a second low side current sink of the prior art that has an emitter degeneration resistor for increased output impedance.

In the current sink circuit 500 of FIG. 4A, as modeled in FIG. 4B, a large fraction of extra injected current is reinjected though the emitter (E) of transistor 530. The feedback loop 550 forces lower the impedance seen looking into the emitter (E) by 1/(the gain of the operational amplifier 520). This acts to multiply the fraction of current reinjected through the emitter (E) to increase by the operational amplifier gain. Therefore, the output impedance, R"o, of the current sink circuit 500 of the present invention is equal to:

$$R''o=Ro(RE*Rpi)(A+1)$$

where RE is the resistance of resistor RE, Rpi is 1/gm, A is the open loop gain of operational amplifier 520 and Ro is the output impedance of the current sink circuit of FIG. 1. In one embodiment of the present invention, the open loop gain, A, is very large and on the order of 35 dB. Therefore, the present invention provides a current sink circuit 500 having an output impedance that is orders of magnitude greater than the output impedances of the current sinks of FIG. 1 and FIG. 2. This effectively reduces the effects of leakage current from the current sink 500.

Figure 5:
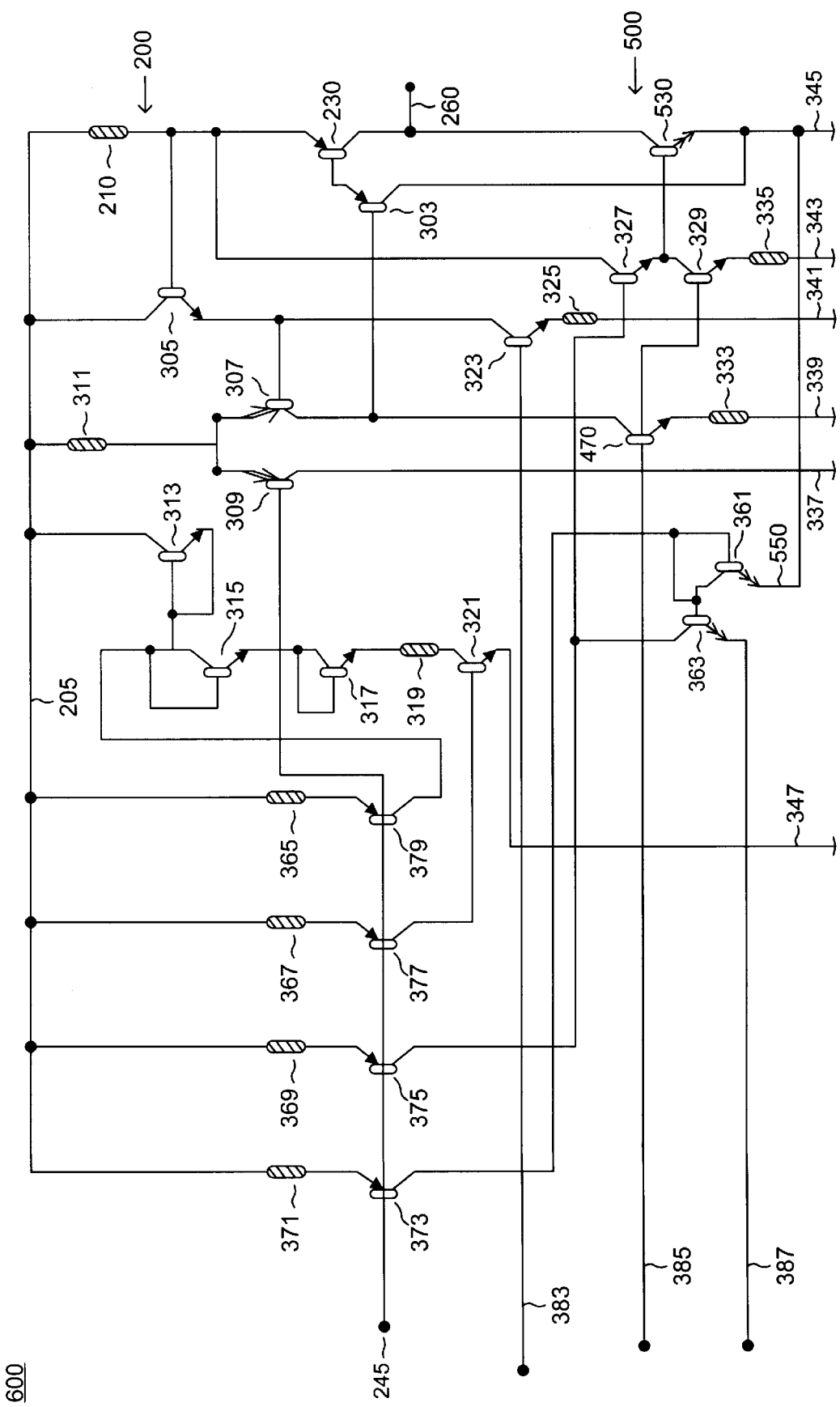
FIG. 5 is a schematic illustrating a first portion of one differential side including the low side current sink circuit in accordance with one embodiment of the present invention.
Figure 6:
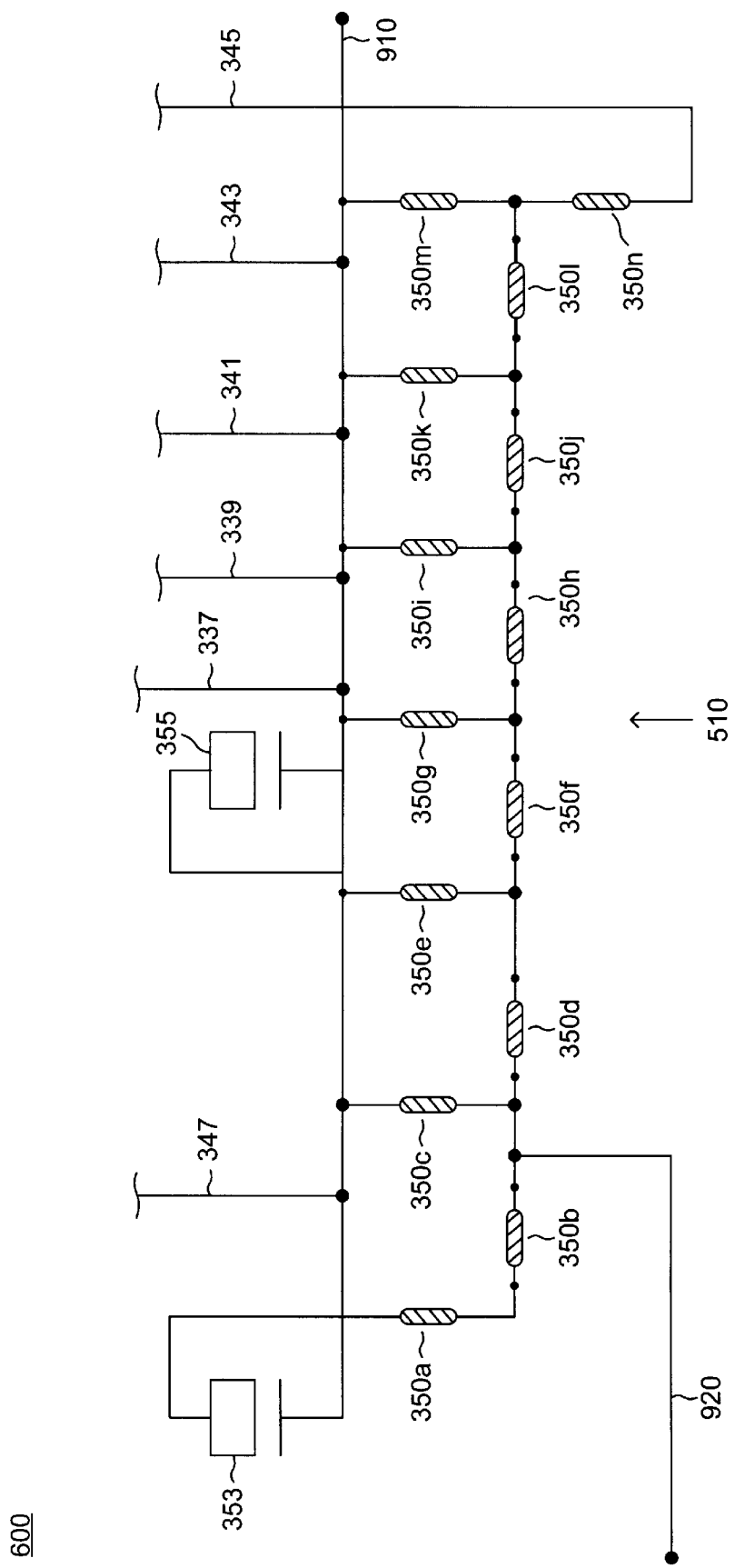
FIG. 6 is a schematic illustrating a second portion of one differential side including the low side current sink circuit in accordance with one embodiment of the present invention.
Figure 7:
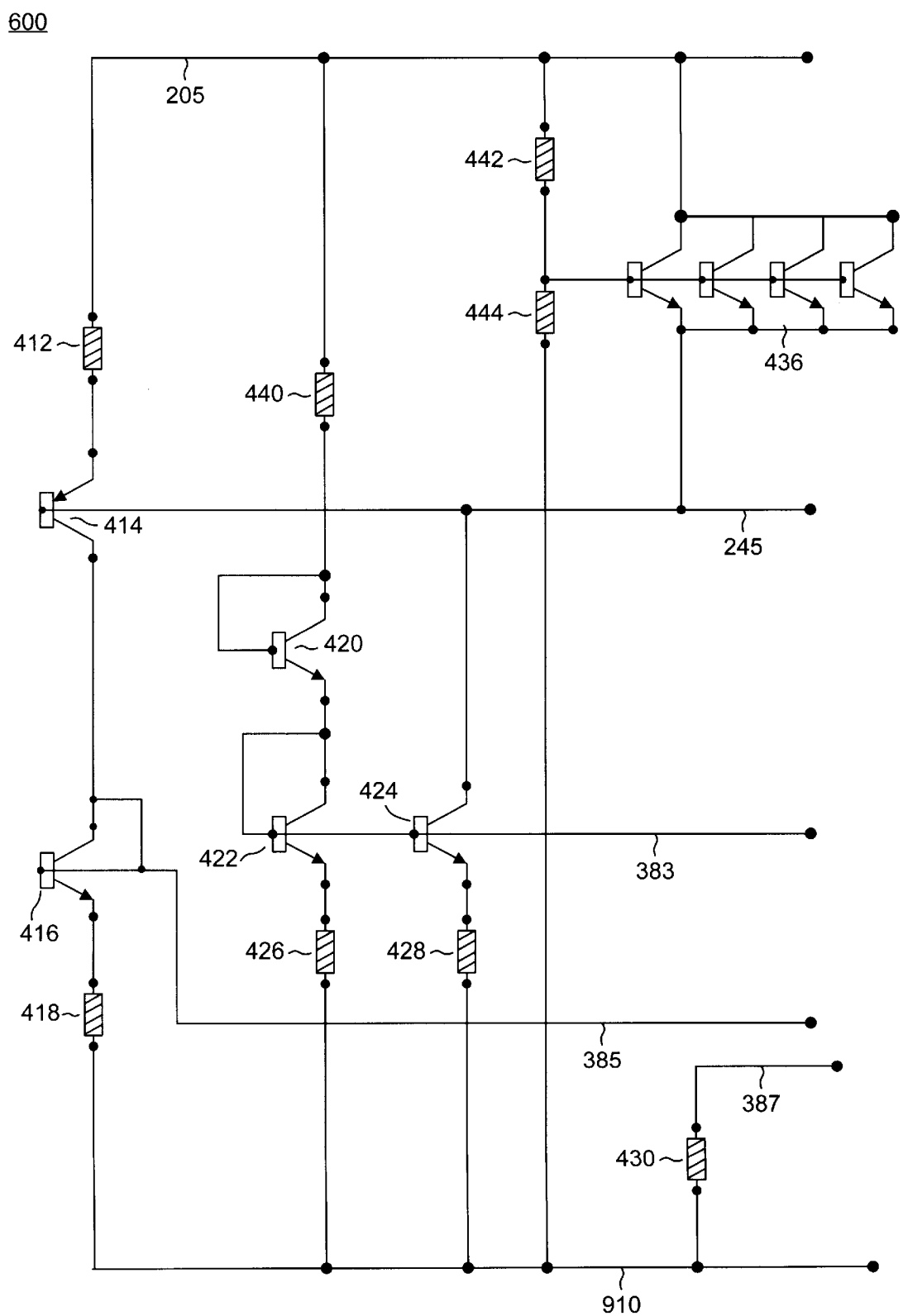
FIG. 7 is a schematic illustrating a third portion of one differential side including the low side current sink circuit in accordance with one embodiment of the present invention.

FIG. 5, FIG. 6 and FIG. 7 illustrate a circuit 600 located within differential side 130*a* (FIG. 3B) that includes current source 200*a* and current sink 500*a* of the present invention but excludes some of the circuitry of the charge pump 810. Because circuit 600 can apply equally well for the differential circuitry of differential side 130*b*, the "a" and "b" notations have been removed from the element references of FIGS. 5–7. Circuit 600 illustrates a particular embodiment of current sink circuit 500 in accordance with the present invention. Specifically, FIG. 6 illustrates a resistor ladder circuit that is used to realize the emitter degeneration resistor RE 510 for current sink 500. FIG. 7 illustrates elements of the operational amplifier circuit 520 and also circuitry used generate the Vbias signal for the current source circuit 200. FIG. 5 illustrates internal circuitry of the operational amplifier 520 used in accordance with one embodiment of the present invention and also illustrates internal circuitry of operational amplifier circuit 220 for current source 200.

With respect to FIG. 5, the emitter degeneration resistor 210 for current source 200 is coupled to Vcc 205. Resistor 210 is coupled to the emitter of transistor 230. The positive (+) input of the operational amplifier circuit 220 is represented by line 245 which is coupled to the base of transistor 309. The negative (−) input of operational amplifier circuit 220 is represented by the base of transistor 305 which is coupled to the emitter of transistor 230 in a feedback loop. The output of operational amplifier 220 is taken at the emitter of transistor 303 which is coupled to the base of transistor 230.

The collector of transistor 230 of FIG. 5 is coupled to output node 260 which is coupled to transistor 530 of current sink 500 of the present invention. Transistor 530 is coupled to line 345 and also coupled to transistor 303 and to transistor 361. The emitter of transistor 230 is coupled to transistor 327 which is coupled to the base of transistor 530 which is also coupled to transistor 329. Transistor 329 is coupled to resistor 335 which is coupled to line 343. The supply voltage 205 is also coupled to transistor 305 which is coupled to the base of transistor 307 and also coupled to transistor 323. Transistor 323 is coupled to resistor 325 which is coupled to line 341. The supply voltage 205 is coupled to resistor 311 which is coupled to both transistors 309 and 307. Transistor 307 is coupled to the base of transistor 303 and also coupled to transistor 470 which is coupled to resistor 333 which is coupled to line 339.

The base of transistor 470 of FIG. 5 is coupled to line 385 which is also coupled to the base of transistor 329. Transistor 309 is coupled to line 337. The base of transistor 361 is coupled to the emitter of transistor 361 and also coupled to the base of transistor 363 and also coupled to transistor 373. Line 387 is coupled to transistor 363. Transistor 363 is coupled to the base of transistor 327 and also coupled to transistor 375. Line 383 is coupled to the base of transistor 323. Line 347 is coupled to transistor 321. In addition to the base of transistor 309, line 245 is coupled to the bases of transistors 373, 375, 377 and 379.

The supply voltage 205 of FIG. 5 is also coupled to transistor 313.

The collector of transistor 313 is coupled to the base of collector 313 and also to the collector of transistor 315 and to the base of transistor 315 and to transistor 379. Transistor 315 is coupled to the collector and base of transistor 317. Transistor 317 is coupled to resistor 319 which is coupled to transistor 321. The supply voltage 205 is also coupled to resistors 371, 369, 367 and 365. Resistor 371 is coupled to transistor 373. Resistor 369 is coupled to transistor 375. Resistor 367 is coupled to transistor 377. Resistor 365 is coupled to transistor 379.

It is appreciated that resistor 311 of FIG. 5 is used between the supply voltage 205 and the emitters of transistors 307 and 309 in lieu of a transistor in an effort to increase the operational (e.g., DC) voltage at the emitters of PNP transistors 309 and 307. In low voltage applications (e.g., where the supply voltage 205 is between 2.0 and 3.3 volts), this arrangement acts to increase the dynamic range of the current sink 200 so that the current source can more effectively operate within low voltage environments. The voltage at the emitters of transistor 307 and 309 is a function of the tail current and the bias current.

In addition to the resistor 311, the operational amplifier circuit 220 also contains a level shifting circuit to increase the operational voltage at the emitter of transistor 230 to help increase the dynamic range of current source 200 in low voltage environments. The level shifting circuitry includes PNP transistor 307 and NPN transistor 305. There is a 7/10 volts drop from the voltage supply 205 to the base of transistor 307. From the base of transistor 307 there is a 7/10 volt increase to the base of transistor 305 which is also the emitter of transistor 230. This creates a DC level shift to increase the DC voltage at the emitter of transistor 230. This circuit configuration effectively increases the dynamic linear range of operation for the current source 200 in cases when a low voltage power supply is used. It is desired to have the output of the current source 200 to swing as large as possible to achieve a low VCO gain for the VCO of FIG. 3B. Lines 345, 343, 341, 339, 337 and 347 comprise an interface between the circuitry of FIG. 5 and FIG. 6.

FIG. 6 illustrates circuitry of an exemplary resistor ladder of circuit 600. The resistor ladder 510 is an R-2R ladder and forms the emitter degeneration resistor for current sink 500 of the present invention. The current entering line 920 is roughly equal to the voltage on line 920 (Vp) divided by 2R. The current added to line 345 as a result of the voltage over line 920 is equal to the voltage at line 920 (Vp) divided by 32R or Vp/32R. The value Vp is altered by the charge pump 810 (or 812) of FIG. 3B. With the R-2R ladder 510, resistors 350*c*, 350*e*, 350*g*, 350*i*, 350*k* and 350*m* of FIG. 6 are of resistance 2 R ohms. Resistors 350*b*, 350*d*, 350*f*, 350*h*, 350*j* and 350*l* and 350*n* are of resistance R ohms.

Line 345 of FIG. 6 is coupled to resistor 350*n* which is coupled to both resistors 350*l* and 350*m*. Resistor 350*m* is coupled to line 343 and resistor 350*l* is coupled to resistors 350*k* and 350*j*. Resistor 350*k* is coupled to line 341 which is coupled to resistor 350*l* which is coupled to resistors 350*j* and 350*h*. Line 339 is coupled to resistor 350*l* and resistor 350g which is coupled to resistors 350h and 350f. Line 337 is coupled to resistors 350g and 350e and to capacitor 355. Resistor 350e is coupled to resistors 350f and 350d. Resistor 350d is coupled to resistors 350c and 350b. Resistor 350c is coupled to line 347 which is coupled to capacitor 353 which is coupled to resistor 350a and resistor 350b. Resistors 350b, 350d, 350f, 350h, 350j and 350l are coupled in series. In operation, the current over line 920 is divided by two by each stage of the six stages of the resistor ladder 510 and the remainder is injected into line 345.

FIG. 7 illustrates an exemplary circuit for generating the Vbias voltage over line 245 for current source 220. FIG. 7 also illustrates elements of the operational amplifier circuits 520 and 220. Using a resistor divider technique, Vcc 205 is coupled to resistor 442 which is coupled in series to resistor 444 which is coupled to ground. The node between resistors 442 and 444 is coupled in parallel to the bases of NPN transistors of a buffer circuit 436. The NPN transistors of buffer circuit 436 are also coupled to Vcc 205 and also to line 245. Line 245 is coupled to the base of transistor 414. Buffer circuit 436 makes the Vbias voltage on line 245 less dependent on loading.

Line 245 of FIG. 7 is also coupled to transistor 424 which is coupled to resistor 428 which is coupled to ground. Vcc 205 is coupled to resistor 440 which is coupled to transistor 420 which is coupled to transistor 422 which is coupled to resistor 426 which is coupled to ground. The node between transistors 422 and 420 is coupled to the base of transistors 422 and 424 and supplied as line 383. The node between resistor 440 and transistor 420 is coupled to the base of transistor 420. Node 410 is coupled to resistor 430 and supplied as line 387.

Vcc 205 of FIG. 7 is coupled to resistor 412 which is coupled to transistor 414 which is coupled to transistor 416 which is coupled to resistor 418 which is coupled to ground. The node between transistor 414 and 416 is coupled to the base of transistor 416 and supplied as line 385.

Although a number of different resistor configurations can be used in accordance with the present invention, Table I below illustrates one exemplary resister assignment.

TABLE I

| Resistor | Approximate Resistor Valve (ohms) |
|---|---|
| 210 | 30 k |
| 311 | 30 k |
| 325 | 30 k |
| 335 | 65 k |
| 365 | 60 k |
| 367 | 75 k |
| 369 | 60 k |
| 371 | 75 k |
| 319 | 30 k |
| 333 | 45 k |
| 350 (a,b,d,f,h,j,l and n) | 15 k |
| 350 (c,e,g,i, and k) | 30 k |
| 442 | 3 k |
| 444 | 24 k |
| 440 | 25 k |
| 412 | 60 k |
| 418 | 45 k |
| 426 | 7 k |
| 428 | 27 k |
| 430 | 3 k |

The operation of circuit 600 for current sink circuit 500 of the present invention is now explained with reference to FIG. 5, FIG. 6 and FIG. 7. The operational amplifier 520 includes NPN transistors 327 and 329 as well as NPN transistors 363 and 361 of FIG. 5. The operational amplifier 520 also includes resistor 430 of FIG. 7. Current sources for these transistors are provided by PNP transistors 373 and 375 (FIG. 5) and also from NPN transistor 416 (FIG. 7). They are all set to the same current in one embodiment. This current is set to be the current from PNP transistor 230 (FIG. 5).

The current pulses injected from the charge pump (e.g., charge pump 810) should not be degraded, therefore the operational amplifier 520 consists of NPN transistors. The positive input of the operational amplifier is the emitter of NPN transistor 327. The negative input of the operational amplifier is the emitter of NPN transistor 361 which is coupled to the emitter of transistor 530 via feedback loop 550 (FIG. 5). The output of operational amplifier 520 is the emitter of transistor 327 (also the collector of transistor 329) which is coupled to the base of transistor 530 (FIG. 5).

Since the power supply voltage can be low (e.g., 2.5 to 3.3 volts), it is not desired to impress a large voltage across the emitter degeneration resistor 510. This would limit the differential swing at the collector of transistor 530. In accordance with the present invention, the largest differential swing at the transistor 530 is desired. Limiting the differential voltage swing at the collector of transistor 530 acts to put a lower limit on the gain of the voltage controlled oscillator of the clock generation circuit 100 of FIG. 3B. This in turn is not desirable because it puts a lower limit on the phase lock loop open loop gain and therefore it limits the minimum size of the filter components that can be used within the clock generation circuit 100.

The circuitry within current sink 500 has two feedback loops. The outer loop operates as follows. If transistor 530 is sinking less current than being sourced by transistor 230, then the voltage at the collector of transistor 530 rises. This in turn causes the input and the output of the operational amplifier to increase. This causes the input of the buffer to increase and therefore the emitter voltage of transistor 530 to increase. This increases the amount of current that transistor 530 sinks. This continues until transistor 530 sinks the current supplied by transistor 230.

The inner loop operates as follows. If the collector current of transistor 363 is less than the collector current of transistor 369, then the potential at the base of transistor 327 increases which increases the voltage at the emitter of transistor 530. This increases the base voltage of transistor 363 through the level shift transistor 361. This increases the current in transistor 363. This process continues until transistor 363 sinks the current supplied by transistor 369. Since transistors 363 and 361 are run at the same current, the voltage at the emitter of transistor 363 is the same as the voltage at the emitter of transistor 361 and the emitter of transistor 530.

The improvement in the output impedance of the sink circuit 500 of the present invention depends on the gain, A, of the operational amplifier 520 which depends on the output impedance of transistor 369 of FIG. 5. The output impedance of circuit 500 is R"o as shown below:

$$Ro''=Ro(RE*Rpi)(A+1)$$

where RE is the resistance of resistor RE, Rpi is 1/gm, A is the open loop gain of operational amplifier 520 and Ro is the output impedance of the current sink circuit of FIG. 1.

The operation of circuit 600 for current source 200 is now explained with reference to FIG. 5, FIG. 6 and FIG. 7. The emitter degeneration resistor is resistor 210 as shown in FIG. 5. The inverting side of the operational amplifier 220 is formed by transistors 305 and transistor 307. Tail current is provided by resistor 311. A current sink which is half the tail current is provided by transistor 470. The output of the operational amplifier 220 is at the emitter of transistor 303. The non-inverting side of the operational amplifier 220 consists of transistor 305.

With respect to FIG. 7, the Vbias voltage input is formed by the divider 20 consisting of resistors 442 and 444. Resistor 412, transistor 414, transistor 416 and resistor 418 of FIG. 7 provide the bias line 385 for the current source transistor 470 of FIG. 5.

The operational amplifier topology for current source 200 is designed to operate within low power supply environments where the power supply voltage, Vcc 205, is low (e.g., 2.0 to 3.3 volts). In one embodiment the power supply voltage Vcc 205 is 2.7 volts. Low power supply voltage restricts the size of the voltage that can be impressed across resistor 210. This requires that an NPN input stage (transistor 305) be used in the operational amplifier circuit 220. This NPN transistor 305 also provides level shifting so that a PNP input operational amplifier can be used to simplify the resulting circuit 200. This NPN transistor 305 is therefore followed by a PNP transistor 307.

In one embodiment, a resistor 311 is used to supply tail current in lieu of a transistor due to constraints. This current is constant. A current which is half of the tail current is produced by making a replica of the tail current. This is done using resistor 412 and transistor 414 (FIG. 7) and transistor 416 and resistor 416 where resistor 412 is twice the size as resistor 311 (FIG. 5) thereby producing half of the tail current.

The improvement in the output impedance of the circuit 200 depends on the gain, A, of the operational amplifier 220. The output impedance of circuit 200 is R"o. The gain of the operational amplifier 220 is determined by the Early voltage of transistor 307 divided by (kT/q), as shown below:

$$Ro"=\text{Early Voltage}/(kT/q)=Ro(RE*Rpi)(A+1)$$

where k, T and q are well known values defined by the physics of the transistor and where RE is the resistance of resistor RE, Rpi is 1/gm, A is the open loop gain of operational amplifier 220 and Ro is the output impedance of the current sink circuit of FIG. 1.

The preferred embodiments of the present invention, a low side, low power, current sink circuit having improved output impedance for reducing effects of leakage current, are thus described. While the present invention has been described in particular embodiments, it should be appreciated that the present invention should not be construed as limited by such embodiments, but rather construed according to the below claims.

What is claimed is:

1. A current sink circuit comprising:
   an emitter degeneration resistor coupled to the low side of a supply voltage and coupled to a first node wherein said emitter degeneration resistor comprises an R-2R resistor ladder;
   a transistor device comprising:
   an emitter coupled to said first node;
   a collector coupled to an output node; and
   a base, wherein said current sink circuit supplies current from said output node for a load to be coupled in parallel across said transistor;
   an operational amplifier circuit having an output coupled to said base of said transistor device, said operational amplifier circuit also having a first input and a second input, said first input coupled to said first node to provide a feedback loop, said operational amplifier circuit for maintaining constant any current flowing through said transistor device to provide a high output impedance of said current sink circuit with respect to said load to reduce leakage current therefrom; and
   a bias voltage applied to said second input of said operational amplifier circuit.

2. A current sink circuit as described in claim 1 wherein said transistor device is an NPN transistor device and wherein said low side is ground.

3. A current sink circuit as described in claim 1 wherein said R-2R resistor ladder includes 15 k ohm and 30 k ohm resistor elements.

4. A current sink circuit as described in claim 1 wherein said first input of said operational amplifier circuit is a negative input and wherein said second input is a positive input.

5. A current sink circuit as described in claim 1 wherein said supply voltage is low and wherein further the voltage drop across the emitter degeneration resistor is relatively low to provide a wide voltage swing at said output node in low voltage supply environments.

6. A current sink circuit as described in claim 1 wherein said high output impedance of said current sink circuit is based on an open loop gain of said operational amplifier circuit.

7. A current sink comprising:
   an emitter degeneration resistor coupled to the low side of a supply voltage and coupled to a first node wherein said emitter degeneration resistor is an R-2R resistor ladder;
   a transistor means comprising:
   an emitter coupled to said first node;
   a collector coupled to an output node; and
   a base, wherein said current sink supplies current from said output node for a load to be coupled in parallel across said transistor;
   an operational amplifier means having an output coupled to said base of said transistor means, said operational amplifier means also having a first input and a second input, said first input coupled to said first node to provide a feedback loop, said operational amplifier means for maintaining constant any current flowing through said transistor means to provide a high output impedance of said current sink with respect to said load to reduce leakage current therefrom; and
   a bias voltage applied to said second input of said operational amplifier means.

8. A current sink as described in claim 7 wherein said transistor means is an NPN transistor device and wherein said low side is ground.

9. A current sink as described in claim 7 wherein said R-2R resistor ladder includes 15 k ohm and 30 k ohm resistor elements.

10. A current sink as described in claim 7 wherein said first input of said operational amplifier means is a negative input and wherein said second input is a positive input.

11. A current sink as described in claim 7 wherein said supply voltage is low and wherein further the voltage drop across the emitter degeneration resistor is relatively low to provide a wide voltage swing at said output node in low voltage supply environments.

12. A current sink as described in claim 7 wherein said high output impedance of said current sink is based on an open loop gain of said operational amplifier means.

13. In a clock generator circuit having a phase lock loop circuit, a current sink circuit having a stable output current for maintaining a voltage at the input of a voltage controlled oscillator, said current sink circuit comprising:
- an emitter degeneration resistor coupled to the low side of a supply voltage and coupled to a first node wherein said emitter degeneration resistor is an R-2R resistor ladder;
- a transistor device comprising:
  - an emitter coupled to said first node;
  - a collector coupled to an output node; and
  - a base, wherein said current sink circuit supplies current from said output node for a load to be coupled in parallel across said transistor;
- an operational amplifier circuit having an output coupled to said base of said transistor device, said operational amplifier circuit also having a first input and a second input, said first input coupled to said first node to provide a feedback loop, said operational amplifier circuit for maintaining constant any current flowing through said transistor device to provide a high output impedance of said current sink circuit with respect to said load to reduce leakage current therefrom; and
- a bias voltage applied to said second input of said operational amplifier circuit.

14. A current sink circuit as described in claim 13 wherein said transistor device is an NPN transistor device and wherein said low side is ground.

15. A current sink circuit as described in claim 13 wherein said first input of said operational amplifier circuit is a negative input and wherein said second input is a positive input.

16. A current sink circuit as described in claim 13 wherein said supply voltage is low and wherein further the voltage drop across the emitter degeneration resistor is relatively low to provide a wide voltage swing at said output node in low voltage supply environments.

17. A current sink circuit as described in claim 13 wherein said high output impedance of said current sink circuit is based on an open loop gain of said operational amplifier circuit.

18. A current sink circuit as described in claim 13 wherein said phase lock loop circuit comprises an integrated circuit capacitor element coupled to said output node and wherein said collector of said transistor alters the charge across said integrated circuit capacitor element.

* * * * *